(12) United States Patent
Heeger et al.

(10) Patent No.: US 6,828,583 B2
(45) Date of Patent: Dec. 7, 2004

(54) INJECTION LASERS FABRICATED FROM SEMICONDUCTING POLYMERS

(75) Inventors: Alan J. Heeger, Santa Barbara, CA (US); Marc Pauchard-Strebel, Fribourg (CH); Martin Vehse, Bremen (DE); Ludvig Edman, Umeå (SE); Daniel Moses, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/797,239

(22) Filed: Mar. 9, 2004

(65) Prior Publication Data

US 2004/0206959 A1 Oct. 21, 2004

Related U.S. Application Data

(60) Provisional application No. 60/454,144, filed on Mar. 12, 2003.

(51) Int. Cl.[7] .................. H01L 35/24; H01L 51/00; H01L 29/24; H01L 27/01; H01L 27/12

(52) U.S. Cl. .................. 257/40; 257/81; 257/103; 257/350

(58) Field of Search ............... 372/7, 43; 257/40, 257/81, 103, 347, 350

(56) References Cited

U.S. PATENT DOCUMENTS

| | | | | |
|---|---|---|---|---|
| 2003/0047729 A1 | * | 3/2003 | Hirai et al. | 257/40 |
| 2003/0160235 A1 | * | 8/2003 | Hirai | 257/40 |
| 2004/0065877 A1 | * | 4/2004 | Hayashi et al. | 257/40 |

* cited by examiner

*Primary Examiner*—Ngân V. Ngô
(74) *Attorney, Agent, or Firm*—Fulbright & Jaworski

(57) ABSTRACT

A solid state lasing structure comprising a field effect transistor in which source and drain electrodes are disposed on a semiconducting light emitting organic polymer forming an active layer on a gate whereby current between the source and drain electrodes defines and flows along a channel in the active layer to define a recombination and emission zone.

15 Claims, 5 Drawing Sheets

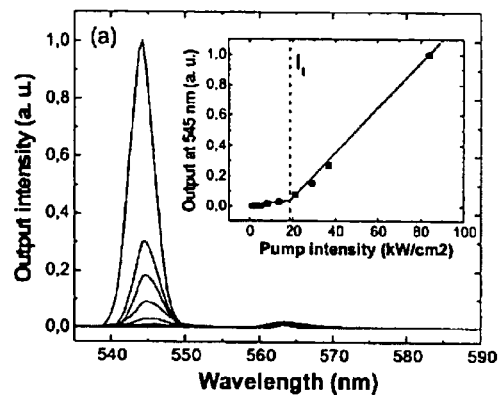 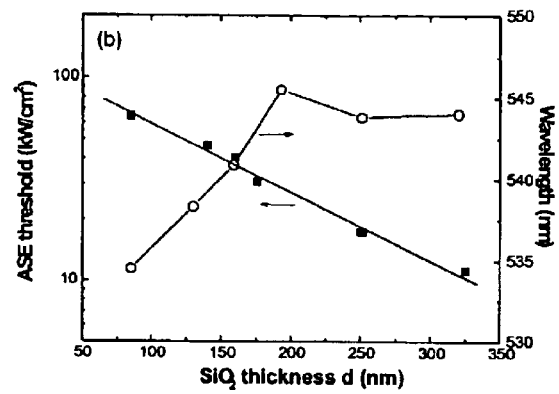
Fig. 7(a)               Fig. 7(b)
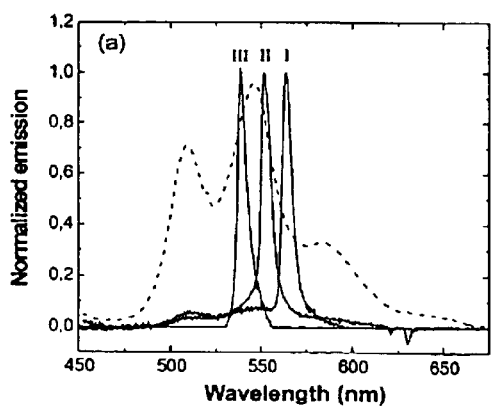 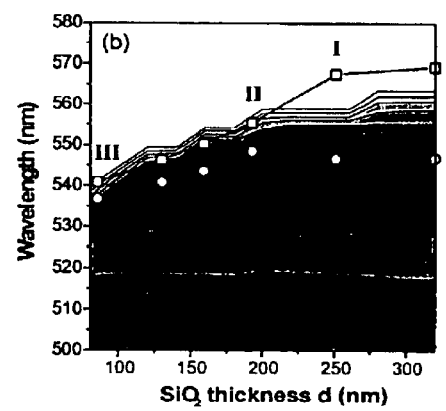
Fig. 8(a)               Fig. 8(b)

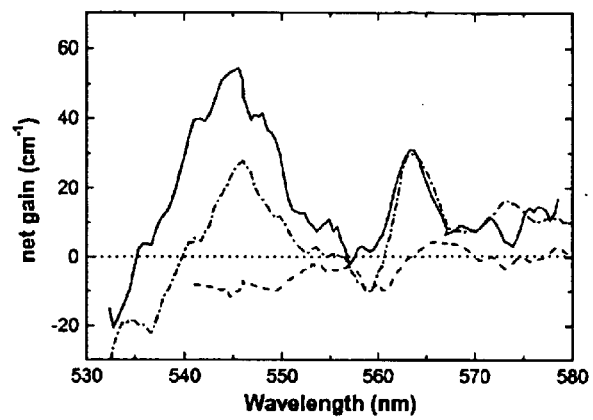
Fig. 9
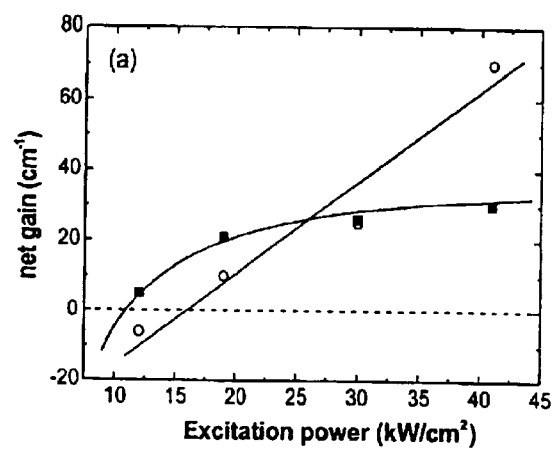 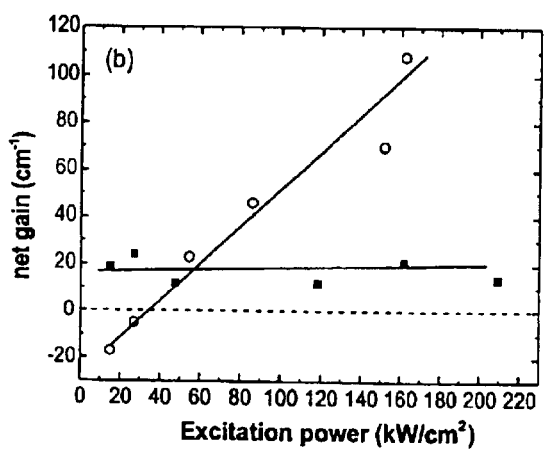
Fig. 10(a)　　　　　　　　Fig. 10(b)

INJECTION LASERS FABRICATED FROM SEMICONDUCTING POLYMERS

CROSS-REFERENCE TO RELATED APPLICATIONS

This application claims the benefit of Provisional patent application No. 60/454,144, filed Mar. 12, 2003.

STATEMENT REGARDING FEDERALLY SPONSORED RESEARCH OR DEVELOPMENT

This invention was made in part with government support under contract F49620-02-1-0127 awarded by the Air Force Office of Scientific Research. The Government has certain rights in this invention.

FIELD OF THE INVENTION

This invention relates to the field of solid state light emitting organic polymers

BACKGROUND OF THE INVENTION

Light-emissive polymers are outstanding laser materials because they are intrinsically "4-level" systems, they have luminescence efficiencies higher than 60% even in undiluted films, they emit at colors that span the visible spectrum and they can be processed into optical quality films by spin casting.

Since the discovery of laser action in polymers in 1992 [U.S. Pat. No. 5,237,582] remarkable progress has been made in implementing semiconducting polymer materials into different resonant structures for optically pumped lasers.[U.S. Pat. No. 5,881,083 and references therein; M. D. McGehee and A. J. Heeger, Adv. Mat. 2000, 12, 1 and references therein]. The high photo-luminescence quantum efficiencies of neat films with emission wavelengths ranging over the entire visible spectrum demonstrates the importance of this class of luminescent semiconducting polymers as gain media.

Early in 1996 Hide et al. [F. Hide, B. Schwartz, M. A. Diaz-Garcia, A. J. Heeger, Chem. Phys. Lett. 1996, 256, 424] observed lasing from polymers in the solid state for the first time when they blended titania nano-particles into a MEH-PPV/polystyrene film in these lasers, the random array of titania particles scattered the light emitted by the MEH-PPV in such a way that the feedback loops needed for lasing were provided. Later in 1996, four research groups independently observed stimulated emission from photo-pumped neat films of conjugated polymers. These observations showed for the first time that neat films, which were capable of conducting current, could in fact amplify light and that it was not unreasonable to attempt to make polymer diode lasers. Graupner et al. observed stimulated emission from films of a poly(para-phenylene)-type ladder polymer (using pump-probe techniques [W. Graupner, G. Leising, G. Lanzani, M. Nisoli, S. D. Silvestri, U. Scherf, Phys. Rev. Left. 1996, 76, 847]. Tessler et al. [N. Tessler, G. J. Denton, R. H. Friend, Nature 1996, 382, 695] obtained lasing by sandwiching poly(p-phenylenevinylene) (PPV) between a dielectric mirror and a silver mirror to form a microcavity. Hide et al. [F. Hide, M. Diaz-Garcia, B. Schwartz, M. Andersson, Q. Pei, A. Heeger, Science 1996, 273, 1833] and Frolov et al. [S. Frolov, M. Ozaki, W. Gellerman, V. Z., K. Yoshino, Jpn. J. Appl. Phys. 1996, 35, L1371; S. Frolov, W. Gellerman, M. Ozaki, K. Yoshino, Z. V. Vardeny, Phys. Rev. Left. 1997, 78, 729] observed line narrowing from films of PPV derivatives that were not part of a resonant structure.

The mechanism of line narrowing was demonstrated to be from amplified spontaneous emission (ASE)[M. D. McGehee, R. Gupta, S. Veenstra, E. K. Miller, M. A. Diaz-Garcia, A. J. Heeger, Phys. Rev. B 1998, 58, 7035]. ASE occurs even when the gain coefficient is small because the spontaneously emitted photons are waveguided and thus travel a large distance through the gain medium, where they are amplified by stimulated emission.

In analogy with organic LEDs, one of the most obvious approaches to the injection laser is to use a vertical cavity laser configuration in which the active material is a thin film between two electrodes [N. T. Harrison, N. Tessler, C. J. Moss, K. Pichler, R. H. Friend, Opt. Mat. 1998, 9, 178; V. G. Kozlov, G. Parthasarathy, P. E. Burrows, V. B. Khalfin, J. Wang, S. Y. Chou, S. R. Forrest, IEEE J. Quant. Electr. 2000, 36, 18; M. A. Diaz-Garcia, F. Hide, B. J. Schwartz, M. D. McGehee, M. R. Andersson and A. J. Heeger, Appl. Phys. Lett, 70, 3191 (1997)]. Despite the fact that threshold current densities estimated from the excitation density required for optically pumped lasers have been exceeded in polymer diode structures by an order of magnitude [N. Tessler, N. T. Harrison, R. H. Friend, Adv. Mater 1998, 10, 64; I. H. Campbell, D. L. Smith, C. J. Neef, J. P. Ferraris, Appl. Phys. Lett. 1999, 75, 841] electrically pumped laser emission has not been demonstrated. The losses in the electrically pumped devices are higher than in simple photo-pumped waveguides because of two additional loss mechanisms: losses introduced by the metal electrodes and charge induced absorption [M. D. McGehee and A. J. Heeger, Adv. Mat. 2000, 12, 1].

BRIEF SUMMARY OF THE INVENTION

The present invention provides a method for overcoming difficulties associated with the losses introduced by the metal electrodes and charge induced absorption by using an architecture known as the light-emitting field effect transistor (LEFET) configuration and to utilize injection-induced amplification of the "cut-off mode" to achieve gain narrowing and lasing. In particular, solid state lasing structure is provided, comprising a field effect transistor in which source and drain electrodes are disposed on a semiconducting light emitting organic polymer forming an active layer on a gate whereby current between the source and drain electrodes defines and flows along a channel in the active layer to define a recombination and emission zone.

In a particular embodiment, a solid state lasing field effect transistor is formed of a solid, semiconducting light emitting organic polymer having a 4-level lasing energy system in which source and drain electrodes on one side and an indium-tin-oxide gate formed on the opposite side define the active layer containing the channel and recombination and emission zone. The gate is supported on a glass substrate and a $SiO_2$ gate insulator layer is disposed between the gate and the light emitting organic polymer.

In a further embodiment, an additional layer of semiconducting organic polymer containing polycations and counteranions (or polyanions and countercations) is disposed between the source and drain electrodes and the light emitting organic polymer, and n and p doped regions are provided therein by applying a source-drain voltage at an elevated temperature for a time sufficient to mobilize the counteranions to form p-i-n junctions upon cooling, with an n doped region in contact with the source electrode and a p-doped region in contact with the drain electrode.

In another embodiment, Bragg or other reflectors are disposed on opposite sides of the channel to provide resonance with feedback whereby to generate coherent laser light.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 7(a) shows the spectra of a BOP-PPV film on a FET structure, with 250 nm $SiO_2$ and 140 nm ITO gate electrode, collected at the sample edge for different pump powers [Inset: output intensity at 545 nm as a function of pump power, where $I_t$ marks the optical gain threshold power];

FIG. 7(b) shows the threshold power (squares) and ASE wavelength (open circles) of BOP-PPV in structures similar to those used in FIG. 7(a), but as a function of the $SiO_2$ thickness (d);

FIG. 8(a) shows the normalized emission spectra of BOP-PPV films on FET structures with a $SiO_2$ thickness of 85 nm (I), 250 nm (II) and 325 nm (III), collected at the sample edge at pump powers below the threshold, $I_t$, of the guided mode, with the emission spectrum of a BOP-PPV film shown as reference (dashed line);

FIG. 8(b) shows the contour plot of the calculated product $\Gamma(\lambda) \times DOS(\lambda)$, in arbitrary units, for the guided TE modes in the FET related structure with 140 nm ITO electrode as a function of the $SiO_2$ thickness d, where the circles represent the experimentally observed ASE wavelength of the guided modes shown in FIG. 7(b) and the squares show the wavelength of the cut-off mode, observed at pump powers below $I_t$ of the guided mode;

FIG. 9 shows the gain spectra of sample I measured at a pump power of 12 kW/cm$^2$ (dashed), 30 kW/cm$^2$ (dash-dotted) and 41 kW/cm$^2$ (solid);

FIG. 10(a) shows the net gain of sample I at 545 nm (squares) and 564 nm (open circles) as a function of the pump power; and FIG. 10(b) shows the net gain of sample III at 540 nm (squares) and 533 nm (open circles) as a function of the pump power, where the solid lines are guides to the eye.

DETAILED DESCRIPTION OF THE INVENTION

Figure 1:
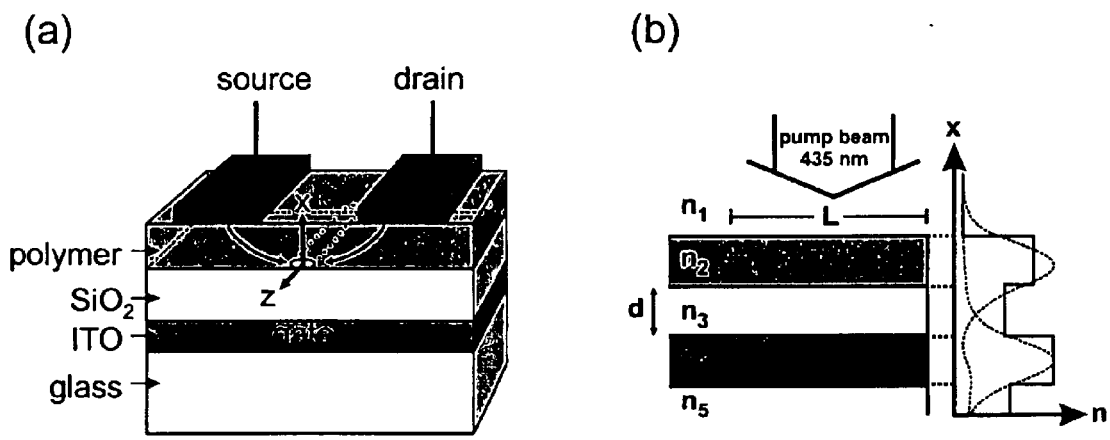
FIG. 1(a) is a perspective schematic depiction of a polymer light emitting FET.
FIG. 1(b) is a cross section of the waveguide structure in the FET channel along the x-z plane.

The use of a LEFET structure (see FIG. 1a) to achieve the organic injection laser offers important advantages. The electrode losses are reduced by the FET structure with gate-induced injection through the source and drain. Since the transport of injected charge carriers (polarons) is perpendicular to the waveguiding structure in which the neutral excitons of the excited polymer are confined, there are relatively few charged carriers in the light propagation pathway. Thus, in the LEFET, charge induced absorption losses will be significantly reduced.

In this LEFET structure, the only electrode interfering with the guided wave is the gate electrode. A recent study [M. Pauchard, J. Swensen, D. Moses, A. J. Heeger, E. Perzon, M. R. Andersson, J. Appl. Phys., 94(5), 2003, 3543] has demonstrated that indium-tin-oxide (ITO) is a promising gate electrode material because it introduces only small losses compared to other materials, e.g. Au or n-Si. FIG. 1(b) shows a schematic picture of the waveguide structure in the channel of such an FET. The structure forms an asymmetric double waveguide because the refractive indices of the ITO (index $n_4$) and the light emitting polymer poly(2-(2',5'-bis(octyloxy)benzene)-1,4-phenylenevinylene (BOP-PPV) [D. M. Johansson, X. Wang, T. Johansson, O. Inganäs, G. Yu, G. Srdanov, M. R. Andersson, *Macromolecules* 2002, 35, 4997](index $n_2$) are higher than that of air (index $n_1$), the gate insulator $SiO_2$ (index $n_3$) and the glass substrate ($n_5$), respectively. The index profile of the waveguide and the mode intensities of the two guided TE modes are shown on the right hand side of FIG. 1(b). The letter "d" refers to the thickness of the gate oxide $SiO_2$ and L is the length of the pump stripe used in the optical experiments described in the text. The refractive index profile and mode intensities of the two supported TE modes of the waveguide are shown on the right side of FIG. 1(b). The optical modes propagate along the z direction, and the light leaves the structure at the edge of the device.

As demonstrated in Example 1, amplified spontaneous emission (ASE) within such structures has been investigated by optical excitation of the polymer with a pulsed laser beam (ns pulse width) that is focused to a stripe while measuring the light emitted from the polymer at the edge. The waveguide acts as an optical amplifier in which the spon taneously emitted light traveling along the excited stripe can be amplified. The net gain $g(\lambda)$ of the emitted light in this waveguiding structure is given by $$g(\lambda)=\Gamma(\lambda)\cdot g_{mat}(\lambda)-\alpha_i(\lambda) \quad (1)$$

with $g_{mat}(\lambda)$ being the material gain, $\Gamma(\lambda)$ the optical confinement factor, and $\alpha_t(\lambda)$ the scattering losses of the waveguide, respectively. The material gain, $g_{mat}(\lambda)$, is related to the density of states, DOS($\lambda$), as qualitatively represented by the emission spectrum of the polymer and the re-absorption losses introduced by the spectral overlap of the absorption and emission spectrum. In the case of BOP-PPV, $g_{mat}(\lambda)$ is highest at 545 nm, the emission maximum. The scattering losses $\alpha_t(\lambda)$ can be considered as approximately independent of the wavelength over the relatively narrow spectral range of emission, and re-absorption by the emitting polymer does not play an important role in the spectral region around 545 nm.[19] The dominating wavelength is therefore determined by the maximum of the product $\Gamma(\lambda)\times$DOS($\lambda$).

A good description of the detected ASE intensity $I(\lambda,L)$ for a certain stripe length L at an emission wavelength $\lambda$ can be derived by describing the system as an ideal one dimensional amplifier. A certain fraction of the spontaneous emission $I_{sp}$, which is determined through the spontaneous emission factor $\beta$, is coupled into the guided amplifier mode. These photons can induce stimulated emission along a single pass L through the excited waveguide. The change of the intensity along z is given by $$\frac{I(\lambda, z)}{dz} = \beta I_{sp}(\lambda) + g(\lambda) I(\lambda, z) \quad (2)$$

If saturation effects can be neglected up to the stripe length L, the solution to Eq. (2) is $$I(\lambda, L) = \frac{\beta I_{sp}(\lambda)}{g(\lambda)}(e^{g(\lambda)L} - 1) \quad (3)$$

which corresponds to a nearly exponential increase of the ASE intensity with increasing stripe length L (for $g(\lambda)>0$).

In every asymmetric waveguide structure there exists a cut-off wavelength, $\lambda_{cut-off}$. Wavelengths longer than $\lambda_{cut-off}$ cannot be guided by the waveguide structure. These modes are called "leaky modes" or "quasi modes"; for the "leaky modes", $\Gamma(\lambda)=0$. The transition between guided and leaky modes is defined by $\lambda_{cut-off}$ off of these structures where $$\lambda_{cut-off} = \frac{2\pi h\sqrt{n_2^2 - n_3^2}}{a\,\tan\left(\sqrt{\frac{n_2^2 - n_1^2}{n_2^2 - n_3^2}}\right)}$$

For wavelengths longer than $\lambda_{cut-off}$, there is complete suppression of the net gain; for the leaky modes, $g(\lambda)-\Gamma(\lambda)\times$DOS($\lambda$)=0.

In a simple ray model, the mode at $\lambda_{cut-off}$ travels at an angle $\theta$ in the polymer film that corresponds to the critical angle $\theta_c$ for total reflection at the polymer glass interface. Beyond cut-off, the reflection coefficient for this light ray is smaller than 1, and light continuously leaks out of the waveguide. Thus, for all wavelengths $\lambda>\lambda_{cut-off}$, the light travels in the polymer film with angles $\theta<\theta_c$ leading to diffraction into the glass substrate. Precisely at $\lambda=\lambda_{cut-off}$, the light travels along the polymer glass interface, until it leaves the sample at the edge. Therefore, only light with wavelengths very close to $\lambda_{cut-off}$ can reach the detector at the sample edge. Moreover, just at $\lambda=\lambda_{cut-off}$, the mode fraction travelling in the ITO ($n_4$, see FIG. 1b) goes to zero. As a result, an additional narrow photoluminescence peak, the "cut-off mode", is observed at $\lambda_{cut-off}$.

In this invention, we disclose gain and amplification of the cut-off mode by carrier injection in the LEFET architecture. Referring to FIG. 1(a), to achieve the injection-induced gain, the source and drain can be fabricated from simple metals or metal alloys such as for example, Au, (typically useful for hole injection into semiconducting polymers), Al or low work function metals such as Ca, Ba or Yt (typically useful for electron injection into semiconducting polymer), which are deposited by techniques well known in the art (vapor deposition, sputtering and the like). The source and drain can be fabricated of the same metal or metal alloy or two different materials can be used. In order to get light out of the structure, electrons must be injected through the source and holes through the drain (or vice versa). The injected holes and electrons will recombine in the channel and give off light. The recombination and emission zone is located at the polymer/gate oxide interface. The refractive index change along x defines the asymmetric double waveguide structure and z defines the propagation direction of the light. In the structure of FIG. 1(a), the two carrier injection is achieved by, for example, grounding the gate, and setting the source and drain at positive and negative (or negative and positive) voltages, respectively with respect to the gate.

Figure 2:
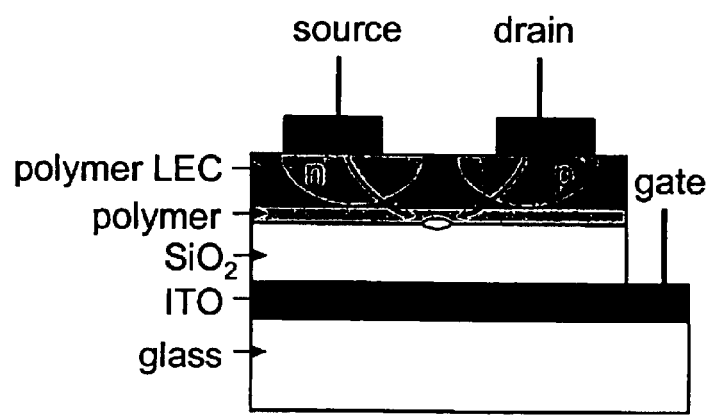
FIG. 2 is a LEFET structure in which the semiconducting polymer is a bilayer.

Alternatively, the source and drain can be implemented using the structure shown in FIG. 2, in which the semiconducting polymer is a bilayer comprising a luminescent polymer layer next to the gate dielectric ($SiO_2$) in the figure and a second layer comprising a material useful for making a light emitting electrochemical cell (LEC). After making the p-i-n junction of the LEC by applying a source-drain voltage, the resulting n-type and p-type doped regions provide the contact through which electrons and holes are injected. In the structure of FIG. 2, the light emitting electrochemical cell (LEC) [Q. Pei, G. Yu, C. Zhang, Y. Yang, and A. J. Heeger, Science 269, 1086 (1995); Q. Pei, Y. Yang, G. Yu, C. Zhang, and A. J. Heeger, J. Am. Chem. Soc. 118, 3922 (1996)] enables the injection of electrons and holes from the source and drain. In FIG. 2, the LEC layer can be a conjugated polymer mixed with an ionic transport medium such as disclosed by Pei et al. [Q. Pei, G. Yu, C. Zhang, Y. Yang, and A J. Heeger, Science 269, 1086 (1995); Q. Pei, Y. Yang, G. Yu, C. Zhang, and A. J. Heeger, J. Am. Chem. Soc. 118, 3922 (1996)]. Alternatively, the LEC layer can utilize a single-component polymer such as, for example, poly[9,9'-bis(6"-(N,N,N-trimethylammonium) hexyl) fluorene-alt-co-phenylene]bromide ($PFN^+Br^-$) as the active material. $PFN^+Br^-$ is a member of a class of semiconducting polymers that is water soluble. In the solid state, $PFN^+Br^-$ is a salt comprising the $PFN^+$ polycation with $Br^-$ as the counteranion. Since the $Br^-$ is mobile at elevated temperatures, the layer in FIG. 2 which is designated as "polymer LEC" can be made into a p-i-n junction in-situ by applying a voltage while the structure is held at a sufficiently high temperature. After, creating the p-i-n junction, the structure is cooled to room temperature, thereby freezing in the p-i-n junction [J. Gao, G. Yu, and A. J. Heeger, Appl. Phys. Lett. 71, 1293 (1997); G. Yu, Y. Cao, M. R. Andersson, J. Gao, and A. J. Heeger, Adv. Mat. 10, 385 (1998)]. LECs have been successfully fabricated from single component systems such as $PFN^+Br^-$ [L. Edman, M. Pauchard, B. Liu, G. Bazan, D. Moses and A. J. Heeger, Appl. Phys. Lett, 83(22), 2003, 44881].

The use of a water soluble or methanol polyelectrolyte for the polymer LEC layer in FIG. 2 offers the additional advantage of enabling two well defined layers with little or no intermixing. For example, in FIG. 2, the polymer layer next to the gate dielectric (shown as $SiO_2$ in FIG. 2) is a polymer which is soluble in common organic solvents such as the well-known derivatized PPVs, for example, MEH-PPV and other semiconducting polymers known in the art [A. J. Heeger, Review of Modern Physics, 2001, 73, 681.] while the LEC layer comprises the water soluble or methanol soluble polyelectrolyte.

In either implementation (FIG. 1(a) or FIG. 2), the number of carriers per unit area, n (electrons or holes) injected into the channel is given by the following equation:

$$n=(k\epsilon_o/e)(V_G/d)$$

where $k\epsilon_o$ is the dielectric constant of the gate insulator, $\epsilon_o$ is free-space dielectric constant, $V_G$ is the gate voltage (with respect to the source or drain) and d is the thickness of the gate insulator. Because of the injected carriers, current will flow as shown schematically in FIG. 1(a). In order to have sufficiently high currents to excite the semiconducting polymer (the gain medium) to levels sufficiently high to realize positive gain, it is advantageous to use gate insulator materials with high dielectric constant, for example aluminum oxide, titanium oxide and other oxides well known in the art.

In the LEFET structure with source and drain electrodes fabricated either as shown in FIG. 1 or FIG. 2, the voltage between the gate and the source and the opposite voltage between the gate and the drain confine the injected carriers (electrons and holes, or more specifically positive and negative polarons) into a thickness of only a few monolayers (a few nm) next to the gate insulator. The region of the active luminescent material which is raised into its luminescent excited state—the gain medium—is the region into which the carriers are confined. Since this region is closely coincident with the region of propagation of the cut-off mode, the confinement factor, $\Gamma(\lambda)_{cut-off}$, see Eqn. 1, is automatically optimized to large values; significantly larger than the corresponding $\Gamma(\lambda)_{guided-mode}$ for the guided mode which progagates through the full thickness of the polymer layer and even extends into the gate dielectric and into the ITO layer (See FIG. 1).

The structures shown in FIGS. 1 and 2 are LEFET structures from which light is emitted from the edge of the polymer along z (see FIG. 1(a)). At sufficiently high injected currents, the region of the polymer near the polymer/insulator interface will be raised to its excited state by the injected charge and thereby have positive gain and serve to amplify the spontaneous emission from the luminescent polymer, i.e. the emission from the edge will be gain-narrowed through amplified spontaneous emission (ASE). Although ASE is properly termed as "laser action", coherent laser emission can only be achieved if the ASE propagates in a resonant structure with feed-back. An example of such a resonant structure which is consistant with amplifaction via the cut-off mode is shown in FIG. 3.

When the Bragg reflector is constructed to reflect at the ASE wavelength, the modified LEFET will emit coherent laser radiation above threshold. Other methods of achieving the necessary resonant structure with feed-back are well know in the art. For example, simple reflection from the edge of the polymer layer can be used (see FIG. 1(a)).

PREFERRED EMBODIMENTS

Figure 3:
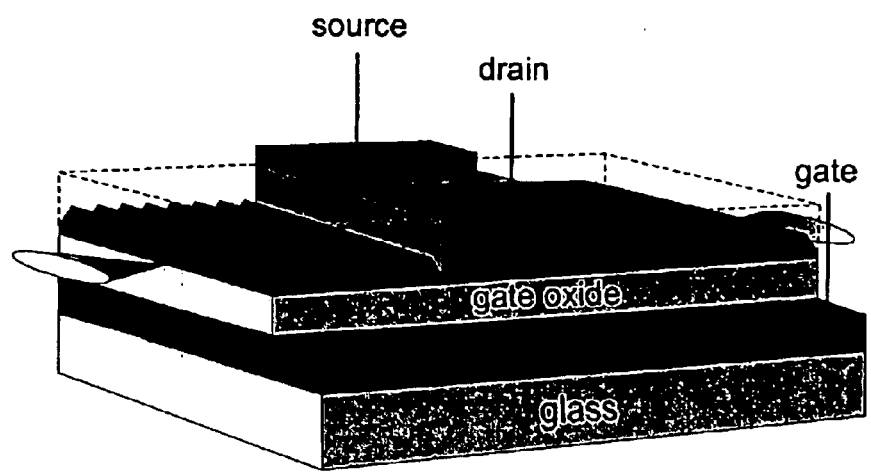
FIG. 3 is a perspective schematic depiction of a LEFET structure with a Bragg reflector on either end.

Preferred embodiments are described in terms of the LEFET structures shown in FIGS. 1(a), 2 and 3. These structures comprise three layers on a substrate:

Layer 1: Semiconducting luminescent layer. As noted in FIG. 2, the semiconducting polymer layer can be a bilayer in order to enhance injection via the formation of an LEC.
Layer 2: Gate insulator material
Layer 3: Gate conducting material Preferred embodiments for Layer 1 include the class of luminescent polymers well known in the art. Examples include soluble derivatives of poly(phenylene vinylene), soluble derivatives of polyfluorene, copolymers containing phenylene vinylene monomers, fluorine monomers, phenyl rings and the like. This class of luminescent semiconducting materials has been widely disclosed in the literature describing the science and technology of polymer light emitting diodes. Specific examples are given in the following: [U.S. Pat. No. 5,881,083 and references therein; M. D. McGehee and A. J. Heeger, Adv. Mat. 2000, 12, 1 and references therein]. More genrally, thin amorphous films comprising small molecules (rather than polymers) can be used in the semiconducting luminescent layer. Such small molecule systems are well-known in the technology of organic light emitting diodes (OLEDS); there are many potentially useful structures documented in the OLED scientific literature and the OLED patent literature.

In a more preferred embodiment, the polymer layer is a bilayer in order to enhance injection via the formation of an LEC. Materials for the LEC layer are well known in the art [Q. Pei, G. Yu, C. Zhang, Y. Yang, and A. J. Heeger, Science 269, 1086 (1995); Q. Pei, Y. Yang, G. Yu, C. Zhang, and A. J. Heeger, J. Am. Chem. Soc. 118, 3922 (1996)]. Even more preferred is the use of single component systems such as poly[9,9'-bis(6"-(N,N,N-trimethylammonium)hexyl)fluorene-aft-co-phenylene]bromide ($PFN^+Br^-$) as the LEC forming material. $PFN^+Br^-$ is a cationic polymer; analogous anionic polymers are also well known; for example the PPV structure derivatized with side chains terminated with $SO^-Li^+$.

Preferred embodiments for Layer 2, the gate insulator layer, including insulating oxides such as $SiO_2$. More preferred embodiments include high dielectric constant insulating oxides such as, for example, $Al_2O_3$, $TiO_2$ and the like. A large number of insulating polymeric materials can be used as the gate insulator. Preferred examples include poly (imides). Again, polymeric materials with high dielectric constant are preferred.

Preferred embodiments for Layer 3, the gate conductor, are transparent conductors such as indium/tin-oxide ITO. The important characteristics are low absorption (low loss) in that part of the spectrum defined by the polymer emission. Other transparent oxide conductors suitable for the gate conductor are well-known in the art. Alternatively, transparent conducting polymers, such as for example, polyaniline (PANI) or poly(ethylenedioxythiophene), PEDOT, can be used as the gate conductor. Since the gate conductor does not carry current, only moderate electrical conductivity is required.

Preferred embodiments for the substrate include transparent materials, for example glass or plastic. Plastic substrates offer the special advantage of flexibility. The use of silicon as the substrate (with a thin layer of doped Si as the gate) is appealing in order to integrate the polymer LEFET lasers as components on silicon chips. Although absorption losses in the silicon must be avoided, the amplification of the cut-off mode which propagates at the polymer/insulator interface minimizes such losses.

The source and drain (see FIG. 1(a)) can be fabricated from simple metals or metal alloys such as for example, Au, (typically useful for hole injection into semiconducting polymers), Al or low work function metals such as Ca, Ba or Yt (typically useful for electron injection into semiconducting polymer), which are deposited by techniques well known in the art (vapor deposition, sputtering and the like). The source and drain can be fabricated of the same metal or metal alloy, or two different materials can be used. In a preferred embodiment, the source and drain can be implemented using the structure shown in FIG. 2.

A number of methods are well-known in the art for providing the feedback necessary in the fabrication of lasers [A. Yariv, Quantum Electronics, 3$^{rd}$ Ed. (Wiley, New York, 1989] including for example, external mirrors, dielectric mismatch reflection. In a preferred embodiment, the external mirrors are Bragg reflectors as shown in FIG. 3.

The following general methods and specific examples are presented to illustrate the invention and are not to be considered as limitations thereon.

Example 1

Light Amplification in Polymer Field Effect Transistor Structures

The amplified spontaneous emission (ASE) of optically pumped films of poly(2-(2',5'-bis(octyloxy)benzene)1,4-phenylenevinylene (BOP-PPV) was studied in structures comprising a gate electrode, a thin film of gate insulator material ($SiO_2$) and the polymer film as luminescent semiconducting layer (i.e. a field effect transistor without the source and drain electrodes). An exponential increase in ASE threshold ($I_t$) with decreasing separation between electrode and polymer layer was observed. In structures with 200 nm $SiO_2$ gate insulator, $I_t=300$ kW/cm$^2$ with an n-Si gate electrode and 200 kW/cm$^2$ with Au electrode (100 nm thick). This increase compared to the same polymer film on pure $SiO_2$ ($I_t=2$ kW/cm$^2$), results from waveguide losses in the nearby gate electrode. With an ITO gate electrode (130 nm thick) on glass, again with a 200 nm $SiO_2$ gate insulator, $I_t=30$ kW/cm$^2$. The ITO electrode acts as a second waveguide, and the light is distributed into two modes. The observed wavelength shift and the increasing $I_t$ with decreasing $SiO_2$ thickness result from this mode structure. When the thickness of the ITO electrode is less than 60 nm, the mode travelling mainly in the ITO is cut-off, and a single waveguide structure is formed with an associated reduction in $I_t$. For an ITO thickness of 12 nm, $I_t=4$ kW/cm$^2$, only two times bigger than that observed in a pure BOP-PPV film on fused silica.

The molecular structure of BOP-PPV is:

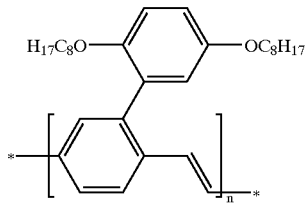

Figure 4:
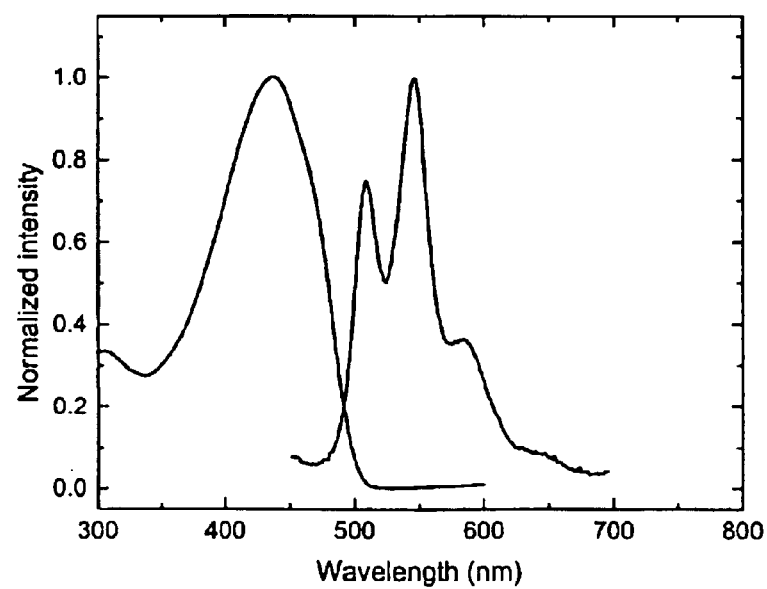
FIG. 4 is a normalized absorption and emission spectra obtained from a BOP-PPV film.

The normalized absorption and emission spectra obtained from a BOP-PPV film are shown in FIG. 4.

The absorption and emission spectra and the ASE threshold ($I_t$) of thin films of the light emitting polymer poly(2-(2',5'-bis(octyloxy)benzene)1,4-phenylenevinylene (BOP-PPV)[12] were measured on BK7 glass substrates. Film thicknesses between 90 nm and 200 nm were obtained by spin-casting the polymer from a 1% p-xylene solution onto the substrate at different spin speeds. The films were prepared in a glove box and dried for 2 h at 70° C. on a hotplate. Film thicknesses were measured by scratching the polymer with a razor blade and measuring the step-height with atomic force microscopy (AFM) in the tapping mode.

Figure 5:
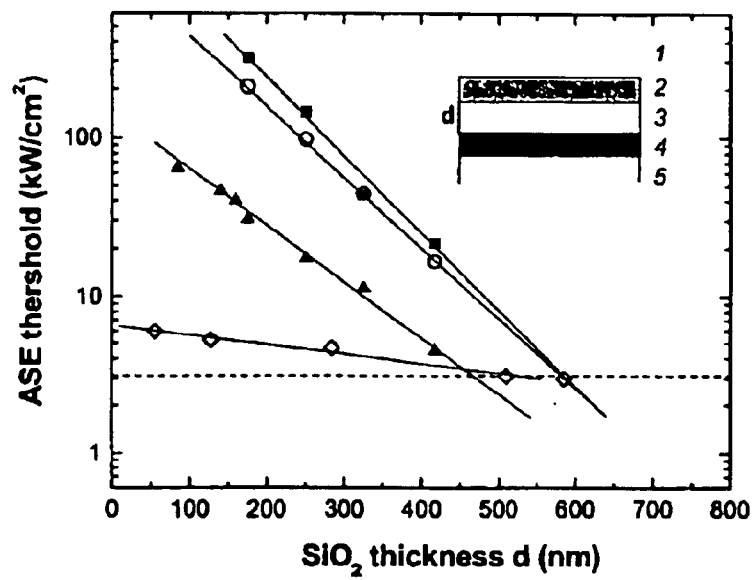
FIG. 5 is a plot showing an ASE threshold of 150 nm thick BOP-PPV films on FET related structures as a function of the $SiO_2$ thickness for different electrode configurations: bulk n-Si (squares), 3 nm Cr/100 nm Au on glass (open circles), 130 nm ITO on glass (triangles), 12 nm ITO on glass (open diamonds) [Inset: cross section of the FET related structures with (1) air, (2) BOP-PPV, (3) gate insulator $SiO_2$, (4) gate electrode and (5) support]

The influence of the gate electrode on it was measured using the structure shown in the inset of FIG. 5 but without the source and drain electrodes. Au, n-Si or ITO were used as electrode materials. Au electrodes (100 nm thick) were evaporated onto a Cr adhesion layer pre-deposited on the glass substrates. The ITO was sputtered onto glass substrates. The electrode thicknesses of the Au and ITO layers were determined by AFM. The gate oxide was thermally deposited onto the electrode material. The thickness was determined by a Dectac profilometer and controlled by ellipsometry of oxide layers grown on Si reference substrates.

The ASE threshold of the samples was measured under $N_2$-atmosphere. The polymer film was pumped at its absorption maximum with a 10 ns laser pulse at 10 Hz. The 435 nm radiation was produced by converting the second harmonic output of a Nd:YAG laser by a high pressure $H_2$-Raman shifter cell. The pump power was varied by using a set of neutral density filters. The laser was focused to a homogeneous stripe with dimensions of 2 mm×350 gm as determined from the full width at half maximum (FWHM) of the spatial intensity profile of the laser radiation. The stripe was positioned at the cleaved edge of the substrate, and the emission was measured perpendicular to the pump direction (from the edge of the stripe) with a fibre coupled CCD camera. The pump power of the laser was measured with a pyroelectric joulemeter. For the ASE measurements, only the pump power actually absorbed by the polymer film was taken into account. This was calculated by taking into consideration the film thickness and the absorption coefficient of the BOP-PPV films at the wavelength of the laser pulse: $\epsilon_{435nm}=5.1\times10^4$ cm$^{-1}$.

As shown in FIG. 5, the ASE threshold (optically pumped) is a sensitive function of the thickness of the gate insulator. With a 200 nm $SiO_2$ gate insulator, the ASE threshold is 300 kW/cm$^2$ if an n-Si gate electrode is used and 200 kW/cm$^2$ if Au is used. This increase of the threshold by a factor of 80–120, compared to a BOP-PPV film on pure $SiO_2$ results from losses introduced by the nearby electrode. The use of a 130 nm thick ITO gate electrode leads to a much lower ASE threshold, $I_t=30$ kW/cm$^2$. The influence of the ITO on the threshold is not explained by a reduction of the PL efficiency, as in the case of the other electrode materials, but rather by the formation of an asymmetric double waveguide structure. The cut-off condition for the amplified mode varies with the $SiO_2$ thickness and influences the ASE threshold and the ASE wavelength. The mode structures and the ASE are sensitive to the ITO thickness. At an ITO thickness of 60 nm, the mode structure changes from a double to a single waveguide. This transition is followed by a reduction of the ASE threshold. For an ITO thickness of 12 nm an ASE threshold of 4 kW/cm$^2$ was measured. Thin ITO films are an excellent choice for the gate electrode for LEFETs.

This Example also demonstrates that the important characteristics of the gate insulator material are high optical quality and low refractive index. The refractive index defines how effectively the active material is shielded from the influence of the gate electrode.

Example 2

Single-Component Light-Emitting Electrochemical Cell

A LEC was fabricated from a single-component polymeric light-emitting electrochemical cell with poly[9,9'-bis (6"N,N,N-trimethylammonium)hexyl) fluorene-alt-co-phenylene]bromide (PFN$^+$Br$^-$) as the active material. Indium-Un-oxide/PFN$^+$Br$^-$/aluminum sandwich structures demonstrate a low and thickness-independent turn-on voltage (2.9V) for blue light-emission. The molecular structure of PFN$^+$Br$^-$ is as follows:

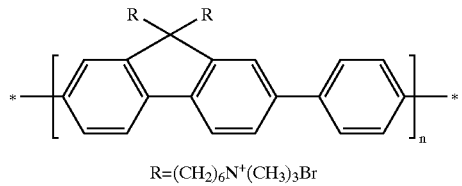

R=(CH$_2$)$_6$N$^+$(CH$_3$)$_3$Br

Thermo-physical characterization by differential thermal calorimetry showed that PFN$^+$Br$^-$ is in a metastable amorphous phase after spin casting, but that recrystallization takes place at elevated temperatures. Therefore, we allowed devices to turn-on via ionic redistribution (and the formation of a p-i-n junction) in the amorphous phase, and then stabilized this desired configuration through recrystallization.

The PFN$^+$Br$^-$ was synthesized through the quaternization of the precursor polymer poly(9,9'-bis(6"-bromohexyl) fluorene-co-phenylene), which was obtained through the Suzuki coupling reaction between 2,7-dibromo-9,9'-bis(6"-bromohexyl)fluorene and 1,4-phenyldibronic acid. For thermophysical characterization, atomic force microscopy (AFM) and differential scanning calorimetry (DSC) were employed. AFM showed that a non heat-treated spin-cast PFN$^+$Br$^-$ film is in an amorphous state at room temperature, but that exposure to higher temperatures gradually transforms the film into a new state. DSC revealed that annealing at an elevated temperature (T≧70° C.) induces recrystallization in amorphous PFN$^+$Br$^-$, as evidenced by a significant exothermal event. A subsequent DSC scan demonstrated a broad endothermal peak centered at 138° C., which consequently should be related to the melting of the crystalline phase. LEC devices were produced by first spin casting a 10 mg/mL methanol solution of PFN$^+$Br$^-$ onto carefully cleaned indium-tin-oxide covered glass substrates. The sandwich cell design was then finalized by thermal evaporation of aluminum top contacts at a pressure of≈10$^{-4}$ Pa. The thickness (d) of the PFN$^+$Br$^-$ layer was directly dependent on the spin speed and ranged between 100 and 270 nm in our experiments. During the preparation process, care was taken not to expose amorphous spin-cast films to elevated temperatures, i.e., T>50° C., in order to prevent recrystallization.

Figure 6:
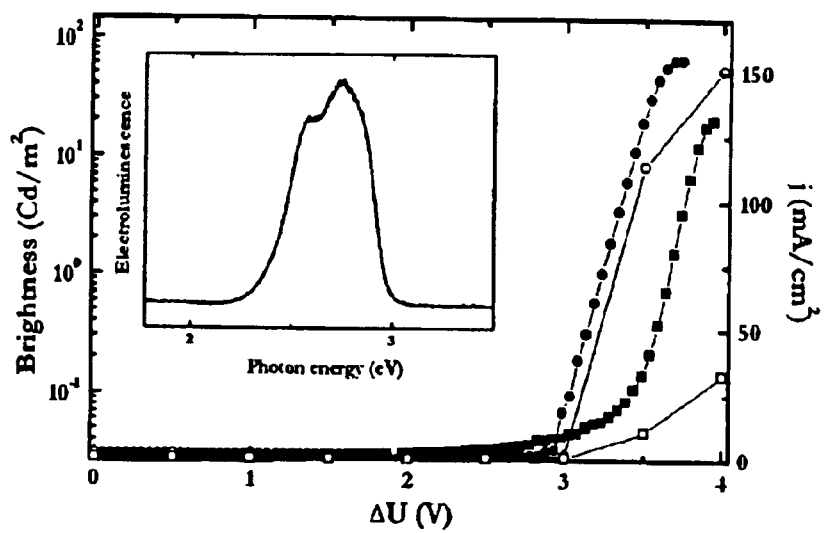
FIG. 6 is a plot showing brightness (circles) and current density (squares) for ITO/PFN$^+$Br$^-$(270 nm)/Al devices as a function of applied potential operated with (open symbols) and without heat management (solid symbols) [Inset: the electroluminescence spectrum of the light emitted from the single component LEC is shown in the inset]

The p-i-n junction was formed in the ITO/PFN$^+$Br$^-$(270 nm)/Al device by applying a voltage between the ITO and AL electrodes while the device was at high temperatures (approx 80° C.), either heated by the injected current (i.e. without heat management) or while heat-sinked at elevated temperature (with thermal management). In either case, after cooling to room temperature, the LEC was operational with light emission from the p-i-n junction. The electroluminescence emission spectrum from the LEC is shown in FIG. 6.

Example 3

Optical Gain of the Cut-Off Mode in Polymer Field Effect transistor structures

Optical gain of the cut-off mode was observed in experiments probing the amplified spontaneous emission of a light-emitting polymer used as the semiconducting material in a field effect transistor related structure. The cut-off mode propagates at the polymer/gate-insulator interface and has an optical gain threshold of approximately 10 kW/cm$^2$. The wavelength of the amplified emission tracks the cut-off wavelength of the asymmetric double waveguide structure and is, therefore, tuneable in wavelength.

FIG. 7(a) presents typical spectra, I(λ), obtained from a BOP-PPV film in the configuration sketched in FIG. 1b, with 251 run SiO$_2$ and 140 nm ITO on glass, at different pump powers with a pump stripe length of L=2 mm. The spectra are dominated by an emission band centred at 545 nm with a full width at half maximum (FWHM) of 4 nm. The inset shows the output intensity at this wavelength as a function of the pump power. The dashed line indicates the optical gain threshold, I$_t$, for the guided mode. FIG. 7(b) represents the measured optical gain threshold (squares) and ASE wavelength (open circles) for similar samples with different oxide thicknesses. The ASE threshold increases exponentially with decreasing thickness of the SiO$_2$ (d), as a result of the losses introduced by the nearby ITO gate electrode. [19]The wavelength of the maximum ASE intensity (open circles) is around 545 nm for thick oxide layers and shifts towards smaller wavelengths for d<200 nm.

As demonstrated in FIG. 7(a), there is a second emission band with wavelength longer than that of the amplified guided mode; i.e. from the cut-off mode. At pump powers below the threshold of the guided mode, the edge emission is dominated by the longer wavelength emission peak with FWHM of 6 nm.

FIG. 8(a) shows the edge emission spectra observed at low pump powers in three different samples, with SiO$_2$ thicknesses of 251 nm (I), 175 nm (II) and 85 nm (III). For comparison, the emission spectrum of a BOP-PPV film measured perpendicular to the surface is shown as the dashed line. The narrow emission at longer wavelength blue-shifts as the SiO$_2$ thickness decreases. Note that the spectral position of the peak from the dominating guided mode also shifts to lower wavelengths with decreasing SiO$_2$ thickness, as shown in FIG. 7(b).

For comparison, the circles in FIG. 8(b) represent the measured ASE peak wavelength (see also in FIG. 7(b)), and the squares represent the spectral positions of the longer wavelength peaks observed in the same structures at low pump power. Note, however, that for sample I, the guided mode is centered at the emission maximum, as demonstrated in FIG. 8(a). Due to the cut-off condition, the guided mode in sample III is shifted to lower wavelength and separated from λ$_{cut-off}$ by only 7 nm, see FIG. 8(b). This means that all the wavelength dependent physical constants, e.g. the refractive index, the re-absorption coefficient, etc. will be identical for the two modes.

For SiO$_2$ thicknesses d>200 nm, λ$_{cut-off}$>545 nm, and the wavelength of the amplified guided mode (circles) is pinned at the wavelength with highest DOS(λ); i.e. equal to the luminescence maximum of BOP-PV. For d<200 nm the cut-off condition shifts below 545 nm. Since wavelengths longer than λ$_{cut-off}$ cannot be guided in these structures, a blue-shift of the wavelength of the amplified guided mode is observed in structures with d<200 nm. This wavelength corresponds exactly to the wavelength of the guided modes with the highest net gain, as seen in the contour plot. The wavelength of the amplified guided mode corresponds to the wavelength of the maximum value of Γ(λ)×DOS(λ) that is available in the guided region for a given d (see FIG. 8(b). Therefore, the influence of the polymer/electrode separation on the wavelength and threshold of the guided mode can be explained by the effect of the cut-off.

The wavelengths of the maxima of the peaks observed in the same structures at low pump power follow exactly the cut-off wavelength, as demonstrated by the squares. This demonstrates with clarity that these narrow emission peaks are not related to a guided mode of the waveguide structure, but arise from the cut-off mode.

To fully characterize the two different modes, the loss coefficient α was determined for both modes in sample III with $SiO_2$ thickness d=85 nm; see FIG. 8(b). Note that although the two modes are separated by only 7 nm in the spectrum, the cut-off mode at 543 nm has a loss coefficient of $\alpha=9$ cm$^{-1}$, compared to $\alpha=63$ cm$^{-1}$ for the guided mode at 538 nm. The much smaller loss for the cut-off mode indicates different propagation characteristics (and hence different accompanying losses) for the two modes. The guided mode is confined in the double waveguide, which is defined by the polymer and the ITO layer. The guided mode is strongly influenced by the gate electrode and is subject to higher electrode losses. The cut-off mode travels at the interface between the polymer and the oxide where the absorption losses are much smaller.

The net gain spectrum can be determined by the ratio $I(\lambda)_1/I(\lambda)_2$ of two ASE intensities related to different stripe lengths $L_1$ and $L_2$, according to the formula $$\frac{I_1(\lambda, L_1)}{I_2(\lambda, L_2)} = \frac{e^{g_{net}(\lambda)L_1} - 1}{e^{g_{net}(\lambda)L_2} - 1}. \quad (4)$$

When using this method, special care must be taken to avoid measurement artifacts that arise from gain saturation.

FIG. 9 shows the gain spectra obtained by this method for sample I at three different pump powers: 12 kW/cm$^2$ (dashed), 30 kW/cm$^2$ (dash-dotted) and 41 kW/cm$^2$ (solid). There are three important observations: First, the gain spectra exhibit a clear spectral separation between the amplification of the cut-off mode and the guided mode. That separation demonstrates nicely that the amplification takes place at two well-defined and separate wavelengths, corresponding to the cut-off mode and the guided mode. Second, the gain peak at higher wavelengths does not match any vibronic sideband of the BOP-PPV emission. Third, high positive net gain is observed for the cut-off mode at pump powers where $g(\lambda_{guided\ mode})<0$. The data clearly demonstrate relatively low threshold optical amplification of the cut-off mode.

FIGS. 10(a) and (b) show the net gain as a function of the pump power, measured at the two wavelengths that correspond to the cut-off mode (squares) and the guided mode (open circles) for samples I and III, respectively. The cut-off mode in FIG. 10(a) has $g(\lambda_{cut-off})>0$ at a pump power of 12 kW/cm$^2$, whereas $g(\lambda_{guided\ mode})<0$ at the same pump power. With increasing pump power, the gain of the cut-off mode starts to saturate and above 25 kW/cm$^2$, the guided mode dominates. Similar results were obtained for sample III (FIG. 10(b)), the only difference being that the threshold for the guided mode has increased by a factor of 2. The increasing threshold is a result of the higher losses introduced by the ITO electrode, as already noted above. In contrast, the gain of the cut-off mode remains positive ($g(\lambda_{cut-off})\approx 15$) with crossover to positive gain at about 10 kW/cm$^2$. Note that at a specific pump power (e.g. at 20 kW/cm$^2$), the gain of the guided mode is very sensitive to the $SiO_2$ thickness (as expected) whereas the gain of the cut-off mode is relatively insensitive to the $SiO_2$ thickness, again implying that the cut-off mode propagates along the polymer/insulator interface and does not experience the influence of the gate electrode.

Cut-off mode propagation along the polymer/insulator interface is in agreement with the observation that the stripe length, L, where saturation effects can be neglected is much smaller in the case of the cut-off mode. When the polymer is pumped optically, the material is equally excited throughout the whole thickness of the film. The guided mode interacts with the inverted region of the whole film, whereas the cut-off mode only interacts with the inverted region at the polymer/gate oxide interface. If the pump power is strong enough to compensate the higher losses of the guided mode, then the guided mode is amplified. Amplification of the guided mode leads to a reduction in the population inversion. For the spatial region where the cut-off mode is amplified by the gain media, this causes additional loss. Hence, the amplification of the guided mode reduces the population inversion in the amplifier medium seen by the cut-off mode, thereby leading to gain saturation for the cut-off mode. Therefore, the different propagation characteristics of the two modes in the optically pumped experiments cause the guided mode to dominate at high pump power and the gain of the cut-off mode to saturate.

The use of a light emitting field effect transistor (LEFET) structure (see FIG. 1a) for the injection laser offers important advantages, particularly for amplification of the cut-off mode. The electrode losses are reduced by the FET structure with gate-induced injection through the source and drain; losses from the gate electrode are significantly lower fro the cut-off mode than for the guided mode. Since the transport of injected charge carriers (polarons) is perpendicular to the waveguiding structure in which the neutral excitons of the excited polymer are confined, there are relatively few charged carriers in the light propagation pathway. Thus, in the LEFET, charge induced absorption losses will be significantly reduced. Finally, because the cut-off mode propagates near the polymer/gate-insulator interface and since the injected electrons and holes are confined near the polymer/ate-insulator interface, the optical confinement parameter, $\Gamma(\lambda)$, should be close to unity. Based upon these results and analyses, we expect that in an electrically pumped LEFET, amplified spontaneous emission and lasing will be more easily achieved at the wavelength of the cut-off mode (or at least the cut-off mode will dominate over a wide power range). Moreover, because the cut-off mode tracks the cutoff wavelength, the ASE wavelength can be tuned by changing the thickness of the gate insulator.

This Example demonstrates that the LEFET with ITO gate electrode provides electrically pumped organic injection lasers by means of amplification of the cut-off mode.

Example 4

Threshold for Lasing in the LEFET Structure

As demonstrated in FIG. 10(a) of Example 3, the threshold for amplification of the cut-off mode is approximately 10 kW/cm$^2$. It is known that the threshold for amplification is reduced by an order of magnitude by using polymer blends in which the emission is shifted to longer wavelengths by Förster energy transfer [R. Gupta, M. Stevenson, A. Dogariu and A. J. Heeger, Appl. Phys. Lett. 73 (24), 3492-4 (1998)]. Thus we estimate the critical current for lasing based on the optical threshold of 1 kW/cm$^2$ for amplification of the cut-off mode. Each photon absorbed leads to one excitation on the polymer. Thus, for the electrically excited injection laser, the threshold corresponds to the current at which injection yields the same number of excitations n the confined region of the cut-off mode. Absorption of 1 kW/cm$^2$ corresponds to injection of 1 kA/cm$^2$. In the LEFET structure, this current must be injected via the source and drain and flow in the channel. Because of the applied gate voltage, electrons and holes are confined to a very thin region, approximately 2 nm in thickness adjacent to the polymer/insulator interface. Thus, for a channel width of 1 mm (1000 μm), the area into which the current is injected is less that $10^{-6}$ cm. Consequently, for gain in the cut-off mode, the injected current must be greater than $2 \times 10^{-5}$ A. Injected currents of this magnitude are readily obtained in FETS fabricated in our laboratory from semiconducting polymers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments described in the specification.

What is claimed is:

1. A solid state lasing structure, comprising a field effect transistor in which source and drain electrodes are disposed on semiconducting material forming an active layer on a gate whereby current between the source and drain electrodes defines and flows along a channel in said active layer to define a recombination and emission zone, said active layer comprising a semiconducting light emitting organic polymer.

2. The lasing structure of claim 1 including a gate insulator between the gate and the light emitting organic polymer.

3. The lasing structure of claim 1 in which said gate is supported on a glass substrate.

4. The lasing structure of claim 1 in which said gate is supported on a silicon substrate with $SiO_2$ on top of the silicon.

5. The lasing structure of claim 1 in which the index of refraction of said light emitting organic polymer and of said gate are greater than the index of refraction of said gate insulator.

6. The lasing structure of claim 3 in which the index of refraction of said light emitting organic polymer and of said gate are greater than the index of refraction of said gate insulator and said glass substrate.

7. The lasing structure of claim 1 in which said gate is formed of indium-tin-oxide.

8. The lasing structure of claim 2 in which said gate insulator is $SiO_2$.

9. The lasing structure of claim 1 in which said light emitting organic polymer has a 4-level lasing energy system.

10. The lasing structure of claim 1 including an additional layer of semiconducting organic polymer between said source and drain electrodes and said light emitting organic polymer being formed with an n doped region in contact with said source electrode, a p doped region in contact with said drain electrode, and an i region therebetween forming a p-i-n junction.

11. The lasing structure of claim 10 in which said additional layer of organic polymer contains polycations and counteranions and said n and p doped regions have been formed by applying a source-drain voltage while said additional layer is heated to an elevated temperature and for a time sufficient to mobilize the counteranions whereby said n doped and p-doped regions and p-i-n junction are formed upon cooling of the additional layer.

12. The lasing structure of claim 1 in which said structure is formed to be resonant with feedback whereby to generate coherent laser light.

13. The lasing structure of claim 12 comprising Bragg reflectors on opposite sides of said channel.

14. A solid state lasing structure, comprising a field effect transistor formed of:

a solid, semiconducting light emitting organic polymer;

source and drain electrodes disposed on one side of said light emitting organic polymer;

a gate on the opposite side of said light emitting polymer, defining an active layer in said light emitting polymer whereby current between the source and drain electrodes flows along a channel in said active layer to define a recombination and emission zone;

a gate insulator between the gate and the light emitting organic polymer; and a glass substrate supporting said gate;

the index of refraction of said light emitting organic polymer and of said gate being greater than the index of refraction of said gate insulator and said glass substrate.

15. A solid state lasing structure, comprising a field effect transistor formed of:

a solid, semiconducting light emitting organic polymer having a 4-level lasing energy system;

source and drain electrodes disposed on one side of said light emitting organic polymer;

an indium-tin-oxide gate on the opposite side of said light emitting polymer, defining an active layer in said light emitting polymer whereby current between the source and drain electrodes flows along a channel in said active layer to define a recombination and emission zone;

a $SiO_2$ gate insulator between the gate and the light emitting organic polymer; and a glass substrate supporting said gate;

the index of refraction of said light emitting organic polymer and of said indium-tin-oxide gate being greater than the index of refraction of said $SiO_2$ gate insulator and said glass substrate.

* * * * *